(12) United States Patent
Gottlieb (10) Patent No.: US 7,139,177 B2
(45) Date of Patent: Nov. 21, 2006

(54) PRINTED CIRCUIT BOARD WITH VOID BETWEEN PINS

(75) Inventor: Gary Gottlieb, Irvine, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 394 days.

(21) Appl. No.: 10/695,100

(22) Filed: Oct. 28, 2003

(65) Prior Publication Data

US 2005/0090137 A1    Apr. 28, 2005

(51) Int. Cl.
*H05K 7/06* (2006.01)
*H05K 7/10* (2006.01)

(52) U.S. Cl. .................. 361/788; 361/777; 361/791; 174/250; 174/255; 174/262

(58) Field of Classification Search ............. None
See application file for complete search history.

(56) References Cited

U.S. PATENT DOCUMENTS

| | | | | |
|---|---|---|---|---|
| 5,699,231 A | * | 12/1997 | ElHatem et al. | 361/752 |
| 6,144,735 A | * | 11/2000 | Bella | 379/399.01 |
| 6,160,843 A | * | 12/2000 | McHale et al. | 375/222 |
| 6,191,472 B1 | * | 2/2001 | Mazumder | 257/691 |
| 6,496,081 B1 | * | 12/2002 | Govind et al. | 333/28 R |
| 6,498,708 B1 | * | 12/2002 | Schilloff et al. | 361/58 |
| 6,506,981 B1 | * | 1/2003 | Liberkowski | 174/262 |

* cited by examiner

*Primary Examiner*—John B. Vigushin
(74) *Attorney, Agent, or Firm*—Fogg and Associates LLC; Jon M. Powers (57) ABSTRACT

A circuit board includes at least one insulator layer and a plurality of conductors over which a plurality of signals is carried. A plurality of terminals is coupled to at least a subset of the plurality of conductors. A void is formed in the circuit board between at least two terminals.

15 Claims, 8 Drawing Sheets

PRINTED CIRCUIT BOARD WITH VOID BETWEEN PINS

TECHNICAL FIELD

The following description relates to printed circuit boards in general and to the spacing of pins mounted on and formed in a printed circuit board, in particular.

BACKGROUND

In one typical configuration, a telecommunications system is housed within a chassis. In such a configuration, various cards are inserted into slots formed within the chassis. The chassis provides mechanical support and environmental, magnetic, and electrical protection and shielding for the cards inserted into the chassis. Typically, a backplane is housed within the chassis. The cards are coupled to the backplane so that the cards are able to communicate with one another over the backplane.

For example, in such a configuration, each card includes a connector (also referred to here as a "backplane connector") that is coupled to a mating connector on the backplane (the latter connector is also referred to here as a "card connector"). Typically, the backplane includes multiple card connectors so that multiple cards can be coupled to the backplane.

In order for a card to be coupled to a backplane, the backplane connector of that card and a corresponding card connector of the backplane must be compatible (that is, mate together). When a new version of a backplane is released, in order for a previously released card (also referred to here as a "legacy card") to be coupled to the new backplane, at least one of the card connectors of the new backplane must be compatible with the backplane connector of the legacy card. Otherwise, the legacy card will not be able to be coupled to the new backplane.

Similarly, when a new version of a card is released, in order for a previously released backplane (also referred to here as a "legacy backplane") to be coupled to the new card, the backplane connector of the new card must be compatible with at least one of the card connectors of the legacy backplane. Otherwise, the new card will not be able to be coupled to the legacy backplane.

SUMMARY

In one embodiment, an article of manufacture includes a circuit board including at least one insulator layer and a plurality of conductors over which a plurality of signals is carried. The article of manufacture further includes a plurality of terminals coupled to at least a subset of the plurality of conductors and a void formed in the circuit board between at least two terminals.

In another embodiment, a backplane includes a printed circuit board having at least one insulator layer and a plurality of conductors over which a plurality of signals is carried. The printer circuit board includes a plurality of holes formed in the printed circuit board. Each of the plurality of holes has a conductive plating coupled to at least one of the plurality of conductors. The printer circuit board further includes a void formed in the printed circuit board between at least two of the plurality of holes.

In another embodiment, a telecommunication system includes a chassis having a plurality of slots, a backplane inserted into the chassis, and a plurality of cards. Each card is inserted into one of the plurality of slots. The backplane includes a backplane circuit board that includes a plurality of backplane conductors over which a plurality of backplane signals is carried. The backplane further includes a plurality of card interfaces. Each card interface includes a plurality of holes formed in the backplane circuit board. Each hole has a conductive plating coupled to at least one of the plurality of backplane conductors. Each of the plurality of cards includes a card circuit board that includes a plurality of card conductors over which a plurality of card signals is carried. Each of the plurality of cards further includes a backplane interface that couples that card to one of the plurality of card interfaces of the backplane. The backplane interface includes a plurality of pins and each pin is coupled to at least one card conductor. At least one of the card interfaces includes a void formed in the backplane circuit board between at least two the plurality of holes included in that card interface.

The details of one or more embodiments of the claimed invention are set forth in the accompanying drawings and the description below. Other features and advantages will become apparent from the description, the drawings, and the claims.

DRAWINGS

Like reference numbers and designations in the various drawings indicate like elements.

DETAILED DESCRIPTION

Figure 1:
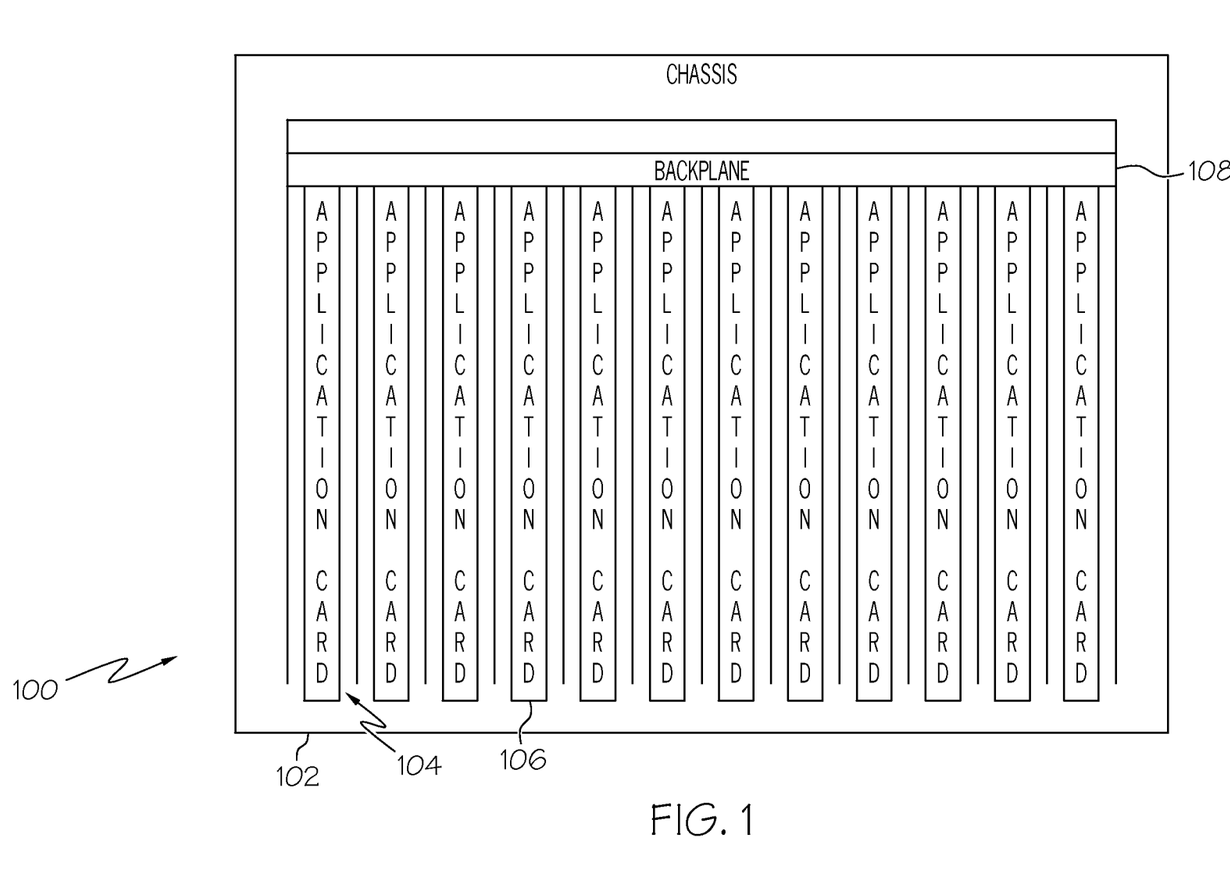
FIG. 1 is a block diagram of one embodiment of a telecommunications system.

FIG. 1 is a block diagram of one embodiment of a telecommunications system 100. The particular embodiment of a telecommunications system 100 shown in FIG. 1 multiplexes multiple downstream T1 or E1 lines into one or more upstream channels (for example, an OC-3, STS-1, DS-3, and DS-1 channel) for transport to an upstream network (for example, a network including a public switched telephone network (PSTN) and/or the Internet).

The system 100 includes a chassis 102 having multiple slots 104. Application cards 106 are inserted into slots 104 and are coupled to a backplane 108 over which one or more of the application cards 106 communicate. The chassis 102 encloses and mechanically supports all the application cards 106 inserted into the chassis 102 and plugged into the backplane 108. The chassis 102 also provides an electrical and magnetic shield for the cards 106 and the backplane 108 housed in the chassis 102.

Each application card 106 and the backplane 108 are implemented using a separate printed circuit board on which various electronic components are mounted. Traces or other conductors included on or within each printed circuit board couple the various electronic components as needed to provide the desired functionality for that application card 106 or the backplane 108.

Figure 2A:
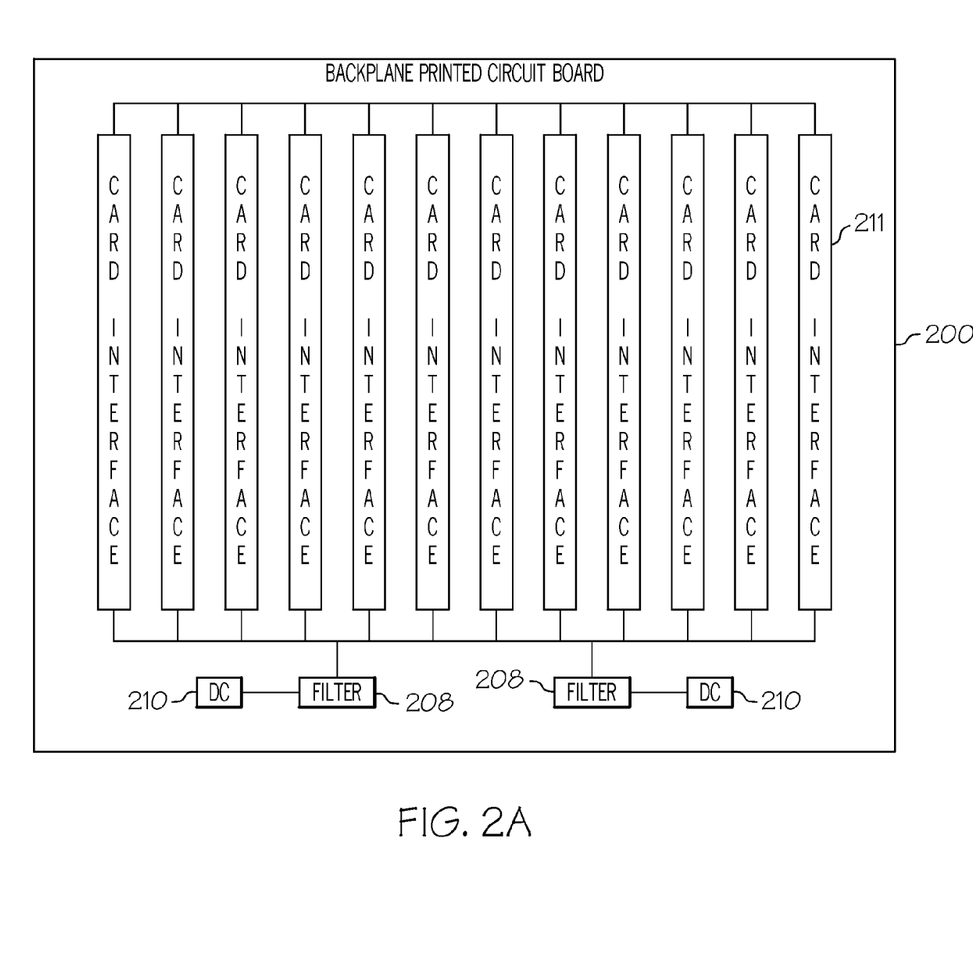
FIG. 2A is a block diagram of one embodiment of a printed circuit board suitable for implementing the backplane of FIG. 1.

FIG. 2A is a block diagram of one embodiment of a printed circuit board 200 suitable for implementing the backplane 108 of FIG. 1. The printed circuit board is also referred to here as the "backplane printed circuit board" 200 or the "backplane PCB" 200. The backplane PCB 200 includes traces, components, and/or interfaces that provide power to and signal interconnections between various types of application cards 106 (for example, line cards, multiplexor cards, and management cards).

For the purposes of illustration, only some of the traces, components, and/or interfaces are shown in FIG. 2. For example, one component mounted on, or otherwise coupled to the backplane PCB 200, is a filter 208 for each of two direct current (DC) power inputs 210 to the chassis 102 in which the backplane PCB 200 is inserted. The filters 208 are mounted on the backplane PCB 200 to reduce radiated and conducted emissions from differential and longitudinal components of noise produced by the application cards 106 plugged into the backplane PCB 200.

Figure 2B:
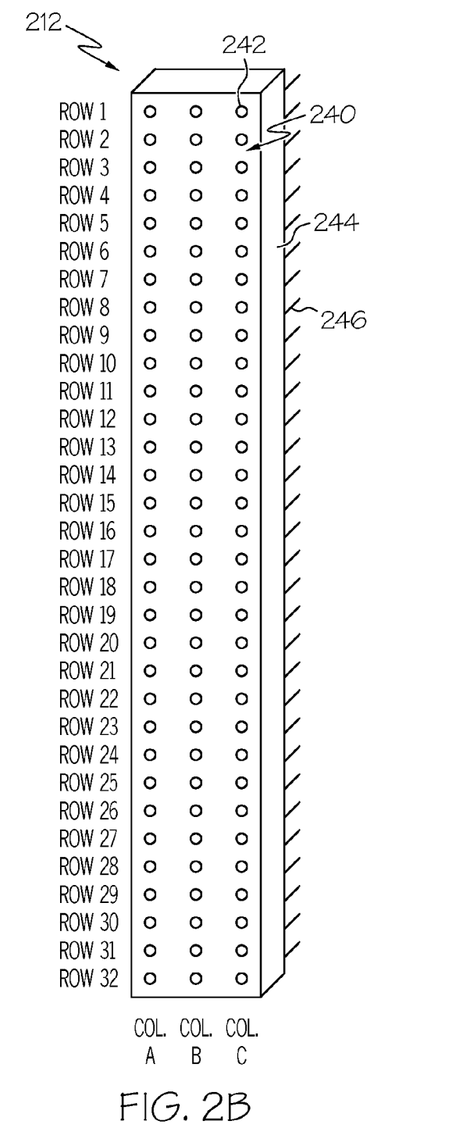
FIG. 2B is a block diagram of one embodiment of a card connector suitable for use with the backplane shown in FIG. 2A.

For each application card 106 that is plugged into the backplane PCB 200, there is a card interface 211. The card interface 211 is used to couple the application card 106 to the backplane PCB 200. In one embodiment, the card interface 211 is implemented using a card connector 212. For example, in one such embodiment, the card connector 212 that is used complies with the Deutsches Insitut für Normung eV (DIN) standard 41612 (such a connector is also referred to here as a "DIN 4162 connector"). FIG. 2B is a block diagram of one embodiment of a card connector 212 suitable for use with the backplane 208 shown in FIG. 2A. The card connector 212 includes an array 240 of sockets 242 formed in a body 244 of the connector 212. The array 240, in this embodiment, includes up to 96 sockets 242 arranged in three columns (labeled A through C in FIG. 2B) of 32 sockets. Each of the 32 rows of sockets shown in FIG. 2B is numbered 1 through 32. The connector 212 also includes connector pins 246 that extend out the surface opposite the array 240 of sockets 242. The connector pins 246 are arranged in the same pattern of as are the sockets 242. In this embodiment, the sockets 242 and the connector pins 246 are separated by 100 milli-inches (mil), measured from center to center.

There is a corresponding connector pin 246 for each socket 242 included in the array 240 that is electrically connected with that socket 242. When a mating connector plug (for example, the backplane connector 312 of application card 300 described below) is connected to the connector 212, pins included in such a connector plug (referred to here as "plug pins") are inserted into respective ones of the array 240 of sockets 242. When this occurs, an electrical connection is formed between each plug pin and a corresponding socket 242 and the connector pin 246 electrically connected to that socket 242.

Figure 2C:
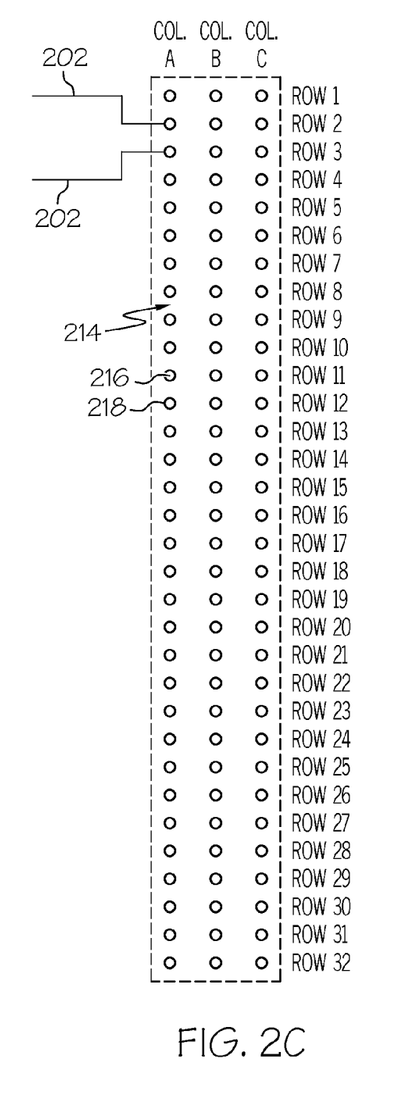
FIG. 2C is a block diagram of one embodiment of an array of holes formed in the backplane printed circuit of FIG. 2A for receiving the connector pins of the card connector of FIG. 2B.

Each card connector 212 is electrically coupled to the backplane PCB 200 by inserting the connector pins 246 into corresponding holes formed in the backplane PCB 200. FIG. 2C is a block diagram of one embodiment of an array 214 of holes 216 formed in the backplane PCB 200. A separate array 214 of holes 216 is formed in the backplane PCB 200 for each card interface 211 (that is, for each card connector 212 that is mounted on the backplane PCB 200).

The connector pins 246 of the card connector 212 are inserted into respective holes 216 when the card connector 212 is mounted on the backplane PCB 200. Consequently, the arrangement of the holes 216 in the backplane PCB 200 matches the arrangement of the sockets 242 and the pins 246 of the card connector 212. For example, in the embodiment shown in FIG. 2C, the array 214 includes up to 96 holes 216 arranged in three columns (labeled A through C in FIG. 2C) of 32 holes. Each of the 32 rows of holes shown in FIG. 2C is numbered 1 through 32. In this embodiment, the holes 216 are separated by 100 mils, measured from center to center. Although FIGS. 2B–2C show 96 connector pins 246 and holes 216, it is to be understood that in some implementations, some of the connector pins 246 and holes 216 are not included.

Each hole 216 is plated with a conductive material (for example, copper or gold). The conductive plating for each hole 216 forms a conductive ring 218 on each surface of the backplane PCB 200 around that hole 216 and along the inner surface of the hole 216 within the backplane PCB 200. Typically, the conductive plating for a hole 216 is coupled to a trace 202 or other conductor included in the backplane printed circuit board 200, for example, over which a signal is carried or that is coupled to ground.

Figure 3A:
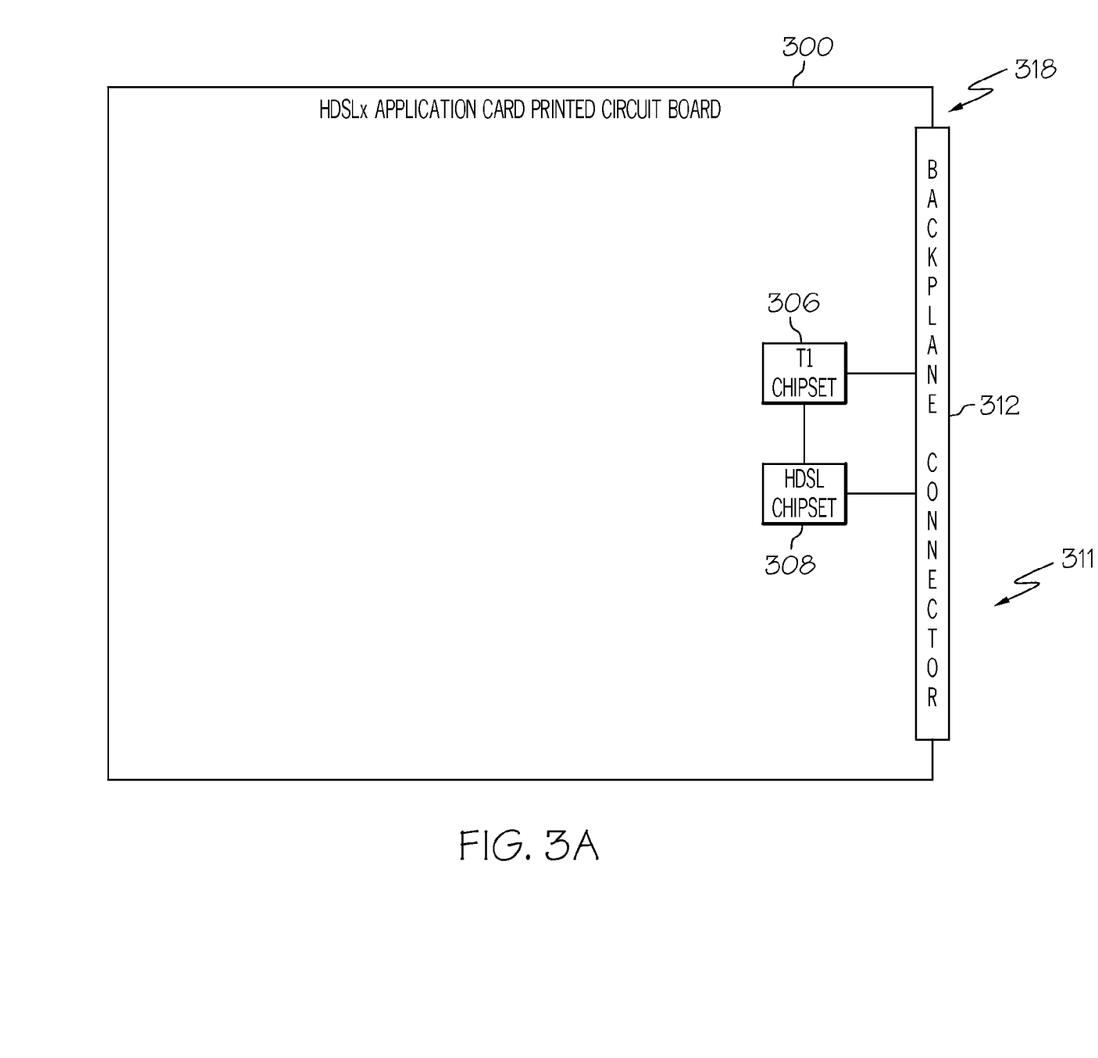
FIG. 3A is a block diagram of one embodiment of a printed circuit board suitable for implementing an application card of FIG. 1.

FIG. 3A is a block diagram of one embodiment of a printed circuit board 300 suitable for implementing an application card 106 of FIG. 1. The printed circuit board 300 is also referred to here as the "application card printed circuit board" 300 or just "application card" 300. The printed circuit board 300 includes traces, components, and/or interfaces that are included in, mounted on, or otherwise coupled to the printed circuit board 300. The traces, components, and/or interfaces implement the functionality of that particular application card 300. For the purposes of illustration, only some of the traces, components, and/or interfaces are shown in FIG. 3A.

In the embodiment shown in FIG. 3A, the printed circuit board 300 is used to implement a high-speed digital subscriber (HDSLx) line interface unit application card (thus, printed circuit board 300 is also referred to here as "HDSLx line interface card" or "HDSLx card" 300). As used herein, HDSLx refers to the family of high speed digital subscriber line technologies, including HDSL, HDSL2 and HDSL4 technologies, that provide a DS-1 channel over one or more twisted-pair telephone lines.

In the embodiment of the HDSLx card 300 shown in FIG. 3A, examples of components mounted on, or otherwise coupled to, the card PCB 300 shown in FIG. 3A, include a T1 chip set 306 and an HDSL chip set 308. The T1 chip set 306 receives and decodes T1 frames received from an upstream DS-1 channel and assembles and transmits T1 frames on the upstream DS-1. In the particular embodiment shown in FIG. 3A, the upstream channel is provided via a multiplexer application card (not shown) that multiplexes several such upstream DS-1 channels into single upstream channel (for example, an upstream DS-3 or STS-1 channel). The HDSL chip set 308 includes the functionality that receives and decodes HDSL frames from the downstream HDSLx channel and assembles and transmits HDSLx frames on the downstream HDSLx channel.

Figure 3B:
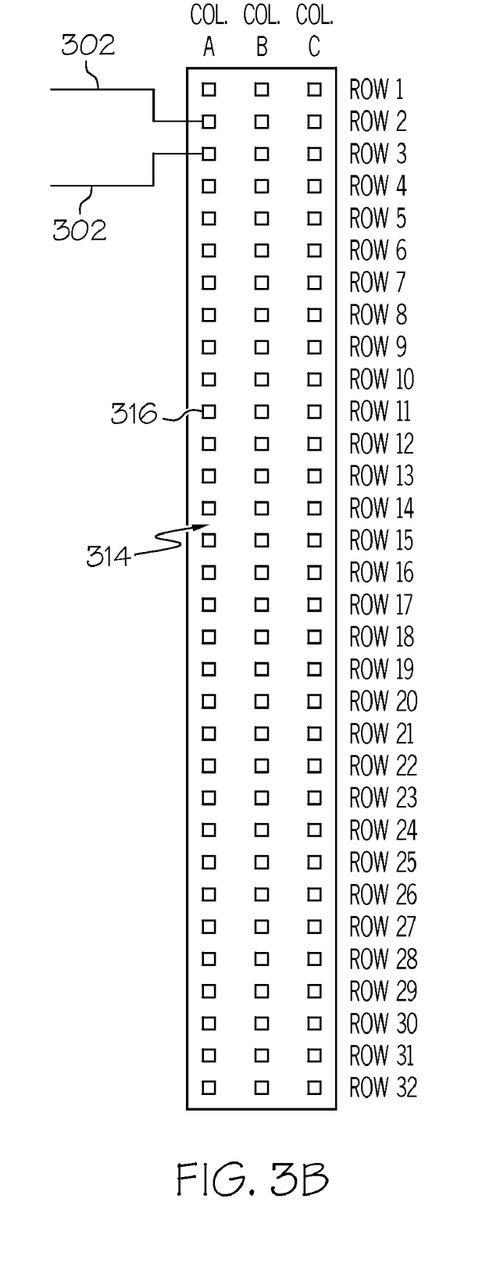
FIG. 3B is a block diagram of one embodiment of an arrangement of plug pins of a backplane connector that mates with the card connector of FIG. 2B.

The HDSLx card 300 includes a backplane interface 311 that is used to couple the HDSLx card 200 to the backplane PCB 200 when the HDSLx card 300 is inserted into a slot 104 of the chassis 102 of FIG. 1. In one embodiment, the backplane interface 311 includes a backplane connector 312. The backplane connector 312 extends from a back edge 318 of the card PCB 300. The backplane connector 312 is implemented as a connector plug that mates with the card connector 212. Such a connector plug includes an array 314 of plug pins 316 (shown in FIG. 3B) that are inserted into respective sockets 242 when the backplane connector 312 is connected to the card connector 212 of the backplane PCB 200. Consequently, the arrangement of the plug pins 316 in the backplane connector 312 matches the arrangement of the sockets 242 of the card connector 212. For example, in the embodiment shown in FIG. 3B, the array 314 includes up to 96 plug pins 316 arranged in three columns (labeled A through C in FIG. 3B) of 32 holes. Each of the 32 rows of holes shown in FIG. 3B is numbered 1 through 32. In this embodiment, the plug pins 316 are separated by 100 mils, measured from center to center and the backplane connector 312 is implemented using a DIN 41612 connector plug.

Each plug pin 316 is conductive (for example, using a copper or gold pin). At least some of the plug pins 316 are coupled to a trace 322 or other conductor included in the application card printed circuit board 300, for example, over which a signal is carried or that is coupled to ground. For example, in one such embodiment, the application card printed circuit board 300 is implemented as a multi-layer printed circuit that includes one or more signal layers.

The holes 216 (and the corresponding the conductive rings 218) are also referred to here as "terminals." Each terminal provides a termination point on a printed circuit board where an external conductor can be coupled to that terminal's respective conductor.

Figure 4A:
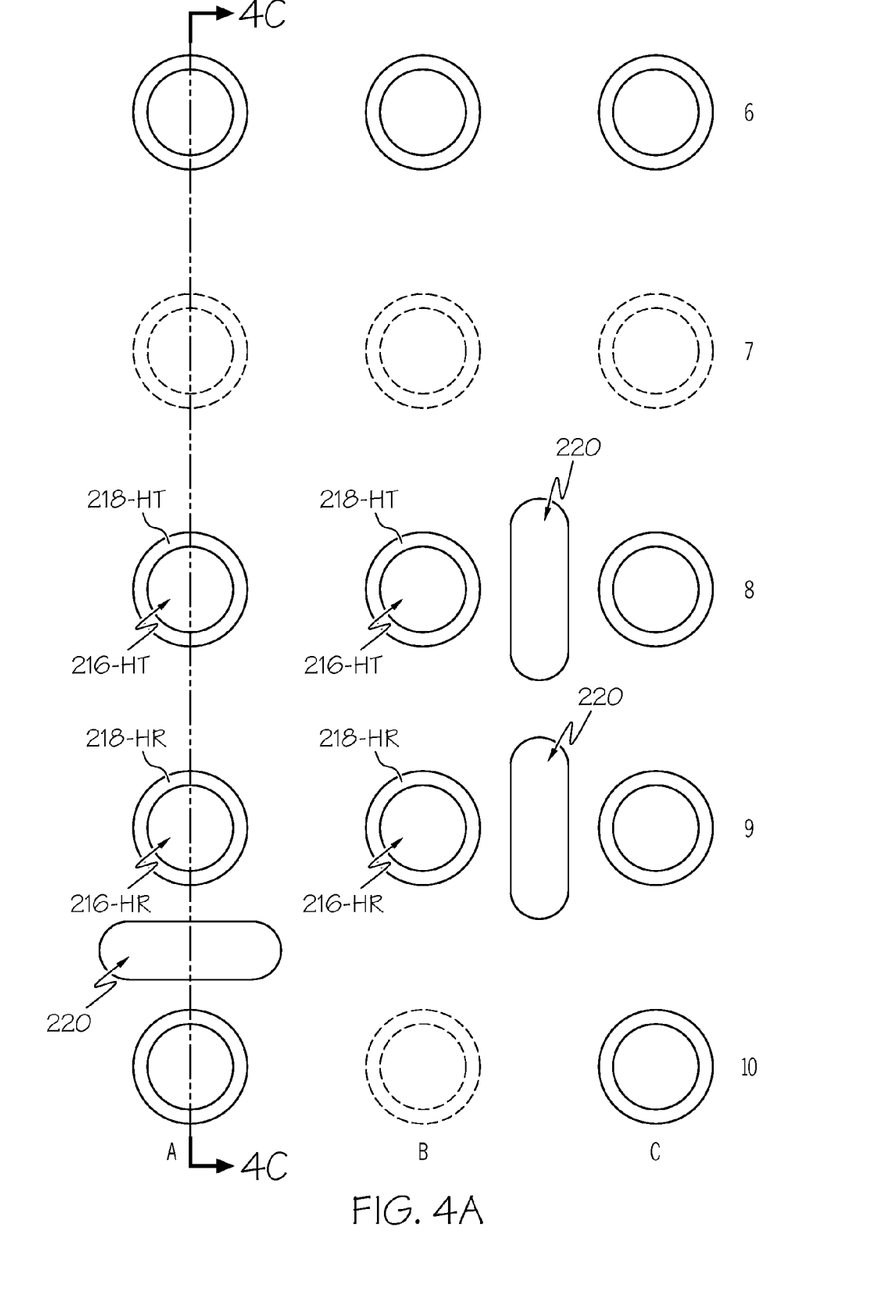
FIGS. 4A–4B are block diagrams showing a portion of one arrangement of holes in a backplane printed circuit board and connector pins of a card connector, respectively.
Figure 4B:
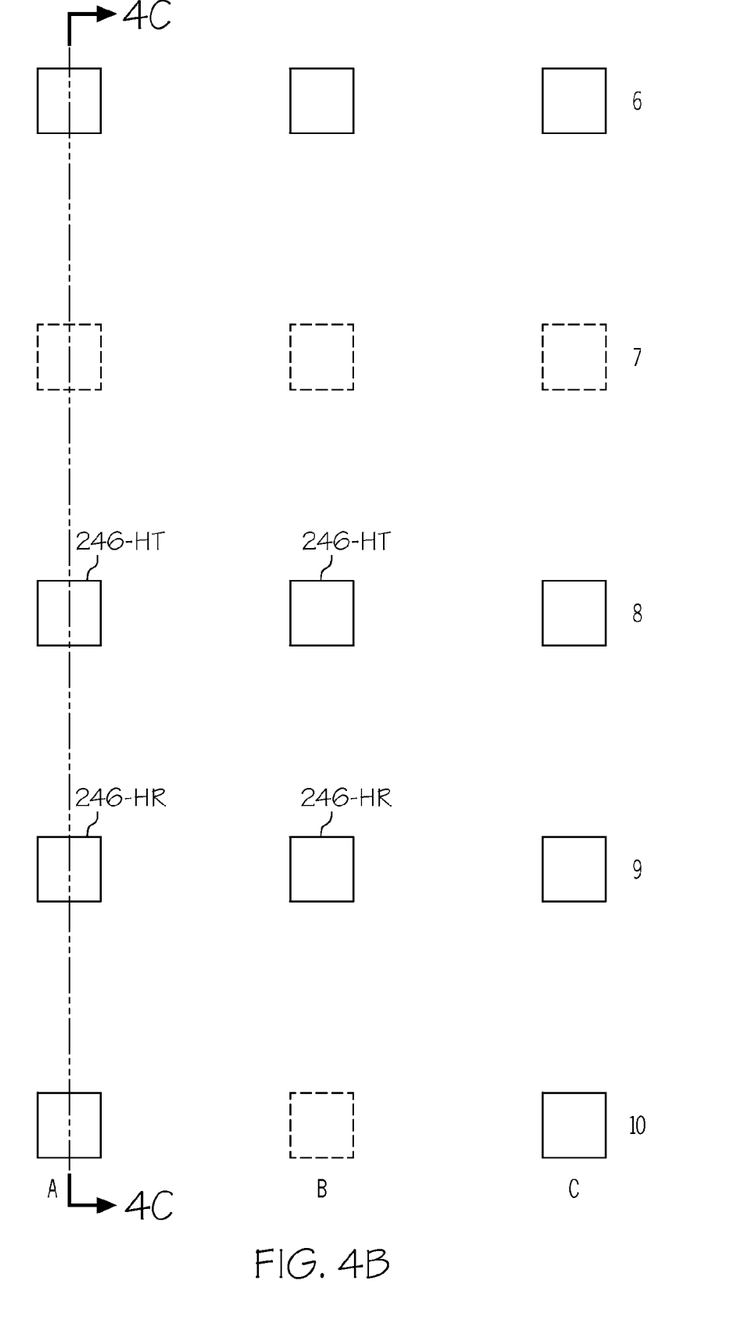

FIGS. 4A–4B are block diagrams showing a portion of one arrangement of holes 216 in the backplane PCB 200 and connector pins 246 of the card connector 212, respectively. Only rows 6 through 10 are shown in FIGS. 4A–4B. In the embodiment shown in FIG. 4A, four holes 216 formed in the backplane PCB 200 (and the related conductive rings 218) are coupled to tip and ring lines of two twisted-pair telephone lines used to provision an HDSLx line.

The two holes 216 that are coupled to the tip lines of the two twisted-pair telephone lines are referred to here as the "tip HDSLx holes" and are referenced in FIG. 4A using reference 216-HT. The conductive rings 218 that correspond to the tip HDSLx holes 216-HT are referred to here as the "tip HDSLx conductive rings" and are referenced in FIG. 4A using reference 218-HT. The holes and corresponding conductive rings located at column A, row 8 (also referred to here as "hole A8" and "conductive ring A8") and at column B, row 8 (also referred to here as "hole B8" and "conductive ring B8") are tip HDSLx holes 216-HT and tip HDSLx conductive rings 218-HT in the embodiment shown in FIG. 4A.

The two holes 216 that are coupled to the ring lines of the two twisted-pair telephone lines are referred to here as the "ring HDSLx holes" and are referenced in FIG. 4A using reference 216-HR. The conductive rings 218 that correspond to the ring HDSLx holes 216-HR are referred to here as the "ring HDSLx conductive rings" and are referenced in FIG. 4A using reference 218-HR. The holes and corresponding conductive rings located at column A, row 9 (also referred to here as "hole A9" and "conductive ring A9") and at column B, row 9 (also referred to here as "hole B9" and "conductive ring B9") are ring HDSLx holes 216-HR and ring HDSLx conductive rings 218-HR in the embodiment shown in FIG. 4A.

The connector pins 246 that are coupled to the tip lines of the twisted-pair telephone lines are referred to here as the "tip HDSLx connector pins" and are referenced in FIG. 4B using the reference 246-HT. The connector pins located at column A, row 8 (also referred to here as "connector pin A8") and at column B, row 8 (also referred to here as "connector pin B8") are tip connector HDSLx pins 246-HT in the embodiment shown in FIG. 4B. The connector pins 246 that are coupled to the ring lines of the twisted-pair telephone lines are referred to here as the "ring connector HDSLx pins" and are referenced in FIG. 4B using the reference 246-HR. The connector pins located at column A, row 9 (also referred to here as "connector pin A9") and at column B, row 9 (also referred to here as "connector pin B9") are ring HDSLx connector pins 246-HR in the embodiment shown in FIG. 4B.

Figure 4C:
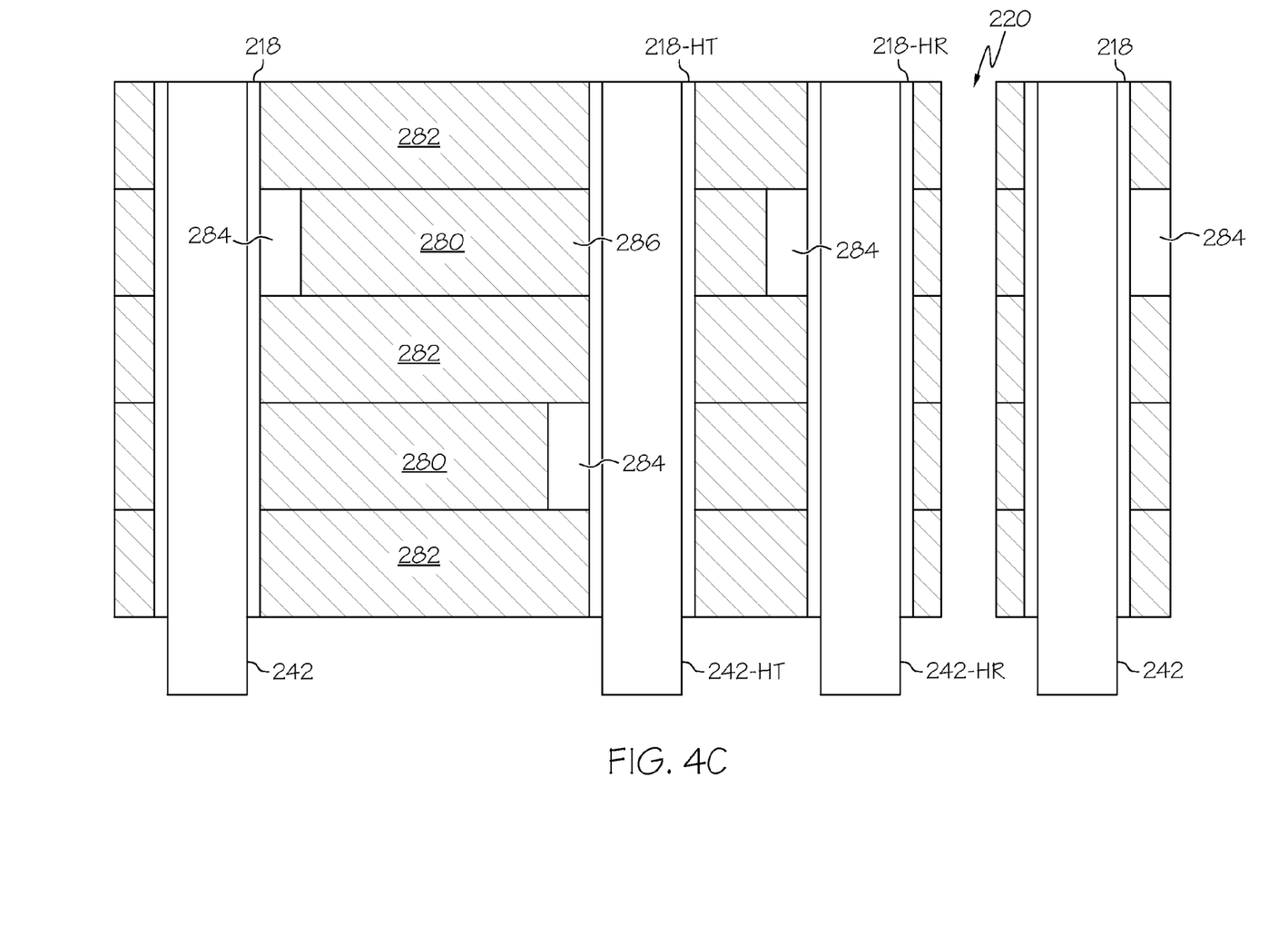
FIG. 4C is cross sectional view along line 4C—4C shown in FIGS. 4A–4B illustrating how the holes in the backplane printed circuit board shown in FIG. 4A mate with the connector pins of the card connector shown in FIG. 4B when the card connector is mounted on the backplane printed circuit board.

FIG. 4C is cross sectional view illustrating how the holes 216 in the backplane PCB 200 shown in FIG. 4A mate with the connector pins 246 of the card connector 212 shown in FIG. 4B when the card connector 212 is mounted on the backplane PCB 200. The cross sectional view shown in FIG. 4C is taken along the line 4C—4C shown in FIGS. 4A–4B. When the card connector 212 is mounted on the PCB backplane 200, the connector pins 246 of the card connector 212 are inserted into respective holes 216 of one of the arrays 214 of holes 216 formed in the backplane 200. An electrical connection is formed between the connector pins 246 and the conductive rings 218. This also electrically couples each conductive ring 218 to the socket 242 that is electrically connected to the connector pin 246 inserted into that conductive ring 218.

In the embodiment shown in FIG. 4C the backplane printed circuit board 200 is implemented as a multi-layer printed circuit in which multiple signal layers 280 are formed on and within insulator layers 282. Each signal layer 280 includes conductors 284 that are separated within that signal layer 280 by portions 286 of insulator. For example, FIG. 4C shows conductors 284 of various signal layers 280 that are coupled to the conductive rings 218-HT and 218-HR. The conductors 284 form, for example, traces within the backplane printed circuit board 200 over which a signal is carried or that is coupled to ground.

In such an embodiment, the insulator layers 282 and the insulator portions 286 of the signal layers 280 are formed, for example, from a dielectric material such as fiberglass, polyamide or other dielectric material and the conductors 284 formed within the signals layers 280 are formed from a conductor such as copper, gold or alloys thereof. In one such embodiment, the signal layers 280 and the insulator layers 282 are formed in the insulator using standard photo etching techniques for multi-layer printed circuit boards.

On Dec. 1, 2000, Underwriters Laboratories, Inc. (UL) released its new standard UL 60950, third edition. All relevant products submitted for approval after Apr. 1, 2005, must comply with UL 60950, third edition. One portion of the UL 60950 standard deals with safety from electrical shock. This portion classifies all signals into functional groups and then provides design rules for the interaction between these groups. These classifications of voltage are important in determining design requirements.

One set of design requirements specify the amount of insulation provided between parts or circuitry within a piece of equipment. One such design requirement specifies the amount of distance between two conductors measured along the surface of a printed circuit board. This is referred to here as "creepage." The creepage requirements of UL 60950 are more stringent than the corresponding creepage requirements contained in the previous relevant UL standard (that is, the UL 1950 standard). However, the UL 60950 standard does not contain any provisions that "grandfather" in equipment that had been previously certified under the UL 1950 standard.

The lack of a grandfather provision in the UL 60950 standard may cause an issue where a telecommunication service provider (or other end user) wishes to purchase a new backplane for use with existing HDSLx cards. In this example, the existing HDSLx cards (also referred to here as "legacy" HDSLx cards or "legacy" cards) were designed for use with a backplane certified under the UL 1950 standard (also referred to here as a "legacy" backplane). However, because of the lack of a grandfather provision in the UL 60950 standard, a new backplane manufactured after the effective date of the UL 60950 standard (that is, after Apr. 1, 2005) must be certified under the UL 60950. In other words, such a new backplane must be certified under the UL 60950 standard while at the same time being interoperable with legacy cards designed for use with a legacy backplane.

In one example, a new backplane is implemented as shown in FIGS. 2A–2C and FIGS. 4A–4C and a legacy card is implemented as shown in FIGS. 3A–3B. For such a new backplane to interoperate with such a legacy HDSLx card, at least one card connector 212 mounted on the new backplane PCB 200 must mate with the backplane connector 312 of the legacy HDSLx card 300. In particular, the arrangement of the array 240 of sockets 242 for one card connector 212 must match the arrangement of the array 314 of plug pins 316. Otherwise, the plug pins 316 will not be able to be inserted into the sockets 242 of a card connector 212 mounted on the new backplane 200 when the legacy HDSLx card 300 is inserted into a chassis 102 in which the new backplane 300. In addition, the particular signals assigned to each of the plug pins 316 and the sockets 242 must also match otherwise appropriate signals will not be communicated between the legacy HDSLx card 300 and the new backplane 200.

It may be the case, however, that the UL 60950 standard requires more insulation between two holes 216 formed in the new backplane 200 than was required by the UL 1950 standard. For example, the tip and ring HDSLx holes 216-HT and 216-HR (and the corresponding conductive rings 218-HT and 218-HR) and the tip and ring HDSLx connector pins 246-HT and 246-HR are part of circuits that are classified by the UL 60950 standard as "TNV-3" circuits. The creepage requirements of the UL 60950 standard require that the distance between a TNV-3 circuit located on a surface of a printed circuit board and another circuit located on the surface of the printed circuit board, as measured along the surface of the printed circuit board, be at least 79 mils.

However, in the embodiment shown in FIGS. 1, 2A–2C, and 4A–4B, the holes 216 of the new backplane 200 are arranged in three rows of 32 holes with 100 mil center-to-center spacing. In such an embodiment, each of the tip and ring HDSLx conductive rings 218-HT and 218-HR are not physically separated from the nearest non-HDSLx conductive rings 218 by at least 79 mils. In such an embodiment with 100 mil center-to-center spacing, the distance between each of the tip and ring HDSLx conductive rings 218-HT and 218-HR and the nearest non-HDSLx conductive ring 218 is 45 mils. Where 2 mils are shaved off each conductive ring (as shown in FIG. 4A with dotted lines), this closest distance can be increased to 49 mils. However, in both cases, this distance does not meet the creepage requirements of the UL 60950 standard.

Simply changing the pin assignments and the corresponding hole assignments in the card connector 212 in order to increase the distance between each of the tip and ring HDSLx conductive rings 218-HT and 218-HR and the nearest non-HDSLx conductive ring 218, however, would result in improper signals being communicated between such a card connector 212 of a new backplane 200 and a backplane connector 312 of legacy HDSLx cards 300.

In the embodiment shown in FIG. 4A, where additional insulation is required for a tip or ring HDSLx conductive ring 218-HT or 218-HR to meet the creepage requirements of the UL 60950 standard, voids 220 are formed in the backplane printed circuit board 200 in between that HDSLx conductive ring 218-HT or 218-HR and the nearest non-HDSLX conductive ring 218. The voids 220 are filled with air and are not, for the purposes of the UL 60950 standard, considered a part of the surface of the printed circuit board 200. Therefore, creepage measurements taken along the surface of the backplane printed circuit board 200 are routed around the voids 220. The size and shape of each void 220 is selected so as to achieve the desired creepage distance.

For example, in the example shown in FIG. 4A, a void 220 is formed in the backplane PCB 200 between the tip HDSLx conductive ring 218-HT at hole B8 and the non-HDSLx conductive ring 218 at hole C8, a void 220 is formed in the backplane PCB 200 between the ring HDSLx conductive ring 218-HR at hole B9 and the non-HDSLx conductive ring 218 at hole C9, and a void 220 is formed in the backplane PCB 200 between the ring HDSLx conductive ring 218-HR at hole A9 and the non-HDSLx conductive ring 218 at hole A10. In the example shown in FIG. 4A, each such void 220 has an oval shape that is 82 mils long and 39 mils wide. The creepage distance between such conductive rings 218 as measured around the void 220 is 84 mils. This creepage distance of 84 mils exceeds the required minimum of 79 mils for a TNV-3 circuit and, therefore, the arrangement of holes 216 shown in FIG. 4A meets the creepage requirements of the UL 60950 standard.

In addition, in the embodiment shown in FIGS. 4A–4C, certain holes 216 and conductive rings 218 (and corresponding connector pins 246 of the card connector 212) are removed from the array 214 of holes 216 (and the array of connector pins 246). The removed holes 216 and conductive rings 218 are shown in FIG. 4A and the removed connector pins 246 are shown in FIG. 4B using dashed lines. Connector pins 246 in row 7 are removed to arrange voids 220 between rows 6 and 8 so that the creepage requirements of the UL 60950 standard are met for various connector pins 246 and holes 216 (for example, between connector pin B8 and connector pin C8).

One particular embodiment is shown in FIGS. 4A–4C. It is to be understood that the formation of voids in a printed circuit board can be used in other embodiments to meet creepage requirements of one or more standards or similar requirements or design goals. For example, in other embodiments, voids are formed in a printed circuit board between other circuit board elements (for example, between other terminals such as pins).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. An article of manufacture, comprising:
a circuit board including at least one insulator layer and a plurality of conductors over which a plurality of signals is carried;
a plurality of terminals coupled to at least a subset of the plurality of conductors; and
a void formed in the circuit board between at least two terminals;
wherein the terminals include a plurality of holes formed in the circuit board, each hole being plated with a conductive ring that is coupled to at least one of the subset of the plurality conductors;
wherein the void is formed in the circuit board between at least two conductive rings; and
further comprising a connector mounted on the circuit board, the connector having a plurality of connector pins, wherein each of the plurality of connector pins is inserted into a respective one of the plurality of holes.

2. The article of manufacture of claim 1, wherein the connector includes a plurality of sockets.

3. The article of manufacture of claim 1, wherein the article of manufacture is a backplane.

4. The article of manufacture of claim 1, wherein the circuit board comprises a multi-layer printed circuit bard.

5. A backplane comprising:
a printed circuit board having at least one insulator layer and a plurality of conductors over which a plurality of signals is carried;
wherein the printed circuit board includes:
a plurality of holes formed in the printed circuit board, each of the plurality of holes having a conductive plating coupled to at least one of the plurality of conductors; and
a void formed in the printed circuit board between at least two of the plurality of holes; and
wherein the printed circuit board further includes a connector mounted on the circuit board, the connector having a plurality of connector pins, wherein each of the plurality of connector pins is inserted into a respective one of the plurality of holes.

6. The backplane of claim 5, wherein the conductive plating of at least one of the plurality of holes between which the void is formed is coupled to a TNV-3 circuit.

7. The backplane of claim 6, wherein the TNV-3 circuit is coupled to a twisted-pair telephone line used to provision a digital subscriber line channel.

8. The backplane of claim 7, wherein the digital subscriber line channel is a high-speed digital subscriber line channel.

9. The backplane of claim 5, wherein the void has an oval shape.

10. The backplane of claim 5, further comprising a direct current power input.

11. The backplane of claim 5, farther comprising a filter.

12. A telecommunication system comprising:
a chassis having a plurality of slots;
a backplane inserted into the chassis; and
a plurality of cards, each card inserted into one of the plurality of slots;
wherein the backplane comprises:
a backplane circuit board that includes a plurality of backplane conductors over which a plurality of backplane signals is carried; and
a plurality of card interfaces, each card interface including a plurality of holes formed in the backplane circuit board, wherein each bole has a conductive plating coupled to at least one of the plurality of backplane conductors;
wherein each of the plurality of cards comprises:
a card circuit board that includes a plurality of card conductors over which a plurality of card signals is carried; and
a backplane interface that couples that card to one of the plurality of card interfaces of the backplane, wherein the backplane interface includes a plurality of pins and wherein each pin is coupled to at least one card conductor, and
wherein at least one of the card interfaces includes a void formed in the backplane circuit board between at least two of the plurality of holes included in that card interface.

13. The telecommunication system of claim 12, wherein the conductive plating of at least one of the plurality of holes between which the void is formed is coupled to a TNV-3 circuit.

14. The telecommunication system of claim 13, wherein the TNV-3 circuit is coupled to a twisted-pair telephone line used to provision a digital subscriber line channel.

15. The telecommunication system of claim 14, wherein the digital subscriber line channel is a high-speed digital subscriber line channel.

* * * * *